United States Patent
Park et al.

(10) Patent No.: US 8,499,441 B2
(45) Date of Patent: Aug. 6, 2013

(54) METHOD OF MANUFACTURING A PRINTED CIRCUIT BOARD

(75) Inventors: Jung-Hwan Park, Seongnam-si (KR); Keungjin Sohn, Suwon-si (KR); Joon-Sik Shin, Suwon-si (KR); Sang-Youp Lee, Seoul (KR); Ho-Sik Park, Suwon-si (KR); Joung-Gul Ryu, Seoul (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 1148 days.

(21) Appl. No.: 12/010,645

(22) Filed: Jan. 28, 2008

(65) Prior Publication Data

US 2009/0084595 A1    Apr. 2, 2009

(30) Foreign Application Priority Data

Sep. 28, 2007    (KR) .................. 10-2007-0098383

(51) Int. Cl.
*H01R 9/00*    (2006.01)
*H05K 3/00*    (2006.01)

(52) U.S. Cl.
USPC .............. 29/842; 29/830; 29/846; 29/852

(58) Field of Classification Search
USPC .............. 29/842, 830, 844, 846, 848, 852, 29/884; 174/250, 255, 256, 258, 261, 262, 174/295; 257/E21.503, E23.062, E23.069, 257/E23.173, E23.179
See application file for complete search history.

(56) References Cited

U.S. PATENT DOCUMENTS

| | | | |
|---|---|---|---|
| 5,162,240 A * | 11/1992 | Saitou et al. | 427/8 |
| 5,865,934 A * | 2/1999 | Yamamoto et al. | 156/295 |
| 6,376,052 B1 * | 4/2002 | Asai et al. | 428/209 |
| 6,906,429 B2 | 6/2005 | Tsubosaki | |
| 6,998,308 B2 * | 2/2006 | Ooi et al. | 438/253 |
| 2003/0147227 A1 | 8/2003 | Egitto et al. | |
| 2006/0012048 A1 | 1/2006 | Murai et al. | |
| 2006/0289203 A1 | 12/2006 | Oda | |
| 2008/0041621 A1 | 2/2008 | Hsu et al. | |

FOREIGN PATENT DOCUMENTS

| | | |
|---|---|---|
| JP | 63-104396 | 5/1988 |
| JP | 10-70363 | 3/1998 |
| JP | 2003-8228 | 1/2003 |
| JP | 2004-153000 | 5/2004 |
| JP | 2007-180105 | 7/2007 |

OTHER PUBLICATIONS

Japanese Office Action issued on May 25, 2010 in corresponding Japanese Patent Application 2008-034487.
U.S. Office Action mailed on Apr. 10, 2012 in related U.S. Appl. No. 12/929,846.

* cited by examiner

*Primary Examiner* — Thiem Phan

(57)    ABSTRACT

A method of manufacturing a printed circuit board includes stacking a solder resist layer on one side of a carrier; forming a first circuit pattern, which includes a first electrode pad, on the solder resist layer; forming a conductive post on the first electrode pad; stacking and pressing the carrier onto an insulation layer stacked in an inner substrate, such that the conductive post faces the insulation layer; and removing the carrier. As the conductive posts are pressed into the insulation layers to implement interlayer connections, certain drilling processes for forming via holes may be omitted, so that the degree of freedom can be increased in designing the circuits, and the circuits can be made to have greater densities. As the circuit patterns are buried in the insulation layers, the board can be made thinner, and the attachment areas can be increased, to allow greater adhesion.

12 Claims, 23 Drawing Sheets

METHOD OF MANUFACTURING A PRINTED CIRCUIT BOARD

CROSS-REFERENCE TO RELATED APPLICATIONS

This application claims the benefit of Korean Patent Application No. 10-2007-0098383 filed with the Korean Intellectual Property Office on Sep. 28, 2007, the disclosure of which is incorporated herein by reference in its entirety.

BACKGROUND

1. Technical Field

The present invention relates to a printed circuit board and a method of manufacturing the printed circuit board.

2. Description of the Related Art

With advances in the electronics industry, there is a growing demand for electronic components that provide higher performance, more functionality, and smaller sizes, and naturally, there have appeared boards for high-density surface-mounted components, such as in an SiP (system in package) or 3D package, etc. To respond to the demands for boards of higher densities and lower thicknesses, there is a need for high-density connections between circuit pattern layers.

Methods of electrically interconnecting layers in a multilayer printed circuit board include methods of plating, methods of printing metal paste to fill via holes with a conductive material, and the so-called "B2IT" methods of implementing interlayer connection by means of conical paste bumps.

The requirements in current printed circuit boards are closely related to the trends of faster performance and higher densities in the electronics market, and to satisfy such requirements, the printed circuit board faces several tasks, such as providing finer circuits, superior electrical properties, higher reliability, higher signal transfer speeds, and greater functionality, etc.

Current electronic products are rapidly progressing towards even greater functionality and even higher speeds. To keep abreast of these trends, the semiconductor chip is undergoing even more rapid developments, as is the board for connecting the semiconductor chip to the main board.

FIG. 1 through FIG. 6 are cross-sectional views representing a flow diagram of a method of manufacturing a printed circuit board according to the related art. Referring to FIGS. 1 to 6, through-holes are processed in a copper clad laminate, which has copper layers formed on either sides of an insulation layer 102, after which electroplating is performed to form vias 106, and an insulating resin 103 is filled inside the inner walls of the vias 106. When the vias 106 are formed for electrically connecting the layers, circuit patterns 104 are formed on the surfaces of the insulation layers to fabricate an inner substrate.

A build-up layer 108 of an insulating material is stacked on each side of the inner substrate, and blind via holes 109 are filled by way of plating to form blind vias 110. Then, circuit patterns 112 are formed on the outermost layers to build up the board. Such build-up layers are stacked on the inner substrate in multiple layers, and solder resists 114 for protecting the circuits are coated on the outermost build-up layers 108 to fabricate a multilayer printed circuit board of a high density.

However, while high-density interlayer connection is required to meet the demands for boards with higher densities and lower thicknesses, there is a limit to implementing high-density interlayer connections when forming vias according to the related art.

Also, methods of manufacturing a printed circuit board according to the related art can lead to the scale of the board being altered, due to the high coefficients of thermal expansion of the insulation layers and the heat generated during the manufacturing process, and can lead to incorrect registration between layers, causing problems in the transfer of electrical signals.

Also, as the coefficient of thermal expansion may be much greater for the solder resists than for the insulation layers, there is a risk of cracks occurring.

Furthermore, while high evenness is required for implementing high densities in a printed circuit board, and such evenness of a board surface is determined by the solder resist, there is a limit to increasing the evenness of the board surface when applying a liquid type solder resist according to the related art.

SUMMARY

An aspect of the invention is to provide a printed circuit board and a method of manufacturing the printed circuit board, in which the interlayer connections between circuit patterns in a multilayer printed circuit board can be implemented in a high density, to increase the degree of freedom in designing the circuits and implement the circuits in higher densities and lower thicknesses.

Another aspect of the invention is to provide a printed circuit board and a method of manufacturing the printed circuit board, in which an insulating material having a low coefficient of thermal expansion is used for the insulation layers and the solder resist layers, to decrease the coefficient of thermal expansion for the entire printed circuit board.

Still another aspect of the invention is to provide a printed circuit board and a method of manufacturing the printed circuit board, in which a solder resist layer can be formed on the surface of the board by way of a carrier, to offer greater evenness in the board surface.

One aspect of the invention provides a method of manufacturing a printed circuit board, which includes stacking a solder resist layer on one side of a carrier; forming a first circuit pattern, which includes a first electrode pad, on the solder resist layer; forming a conductive post on the first electrode pad; stacking and pressing the carrier onto an insulation layer stacked in an inner substrate, such that the conductive post faces the insulation layer; and removing the carrier.

In certain embodiments, the method may further include, after removing the carrier, perforating the solder resist layer such that the first electrode pad is exposed, and performing surface treatment on the first electrode pad.

After the surface treatment, an operation may additionally be included of forming a solder bump on the first electrode pad.

The operation of forming the first circuit pattern may include forming a seed layer on the solder resist layer by performing electroless plating; stacking a first photoresist on the seed layer; selectively removing a portion of the first photoresist in correspondence to a position where the first circuit pattern is to be formed; and performing electroplating with the seed layer as an electrode. In this case, forming the conductive post may include stacking a second photoresist such that the second photoresist covers the first circuit pattern and the first photoresist; selectively removing a portion of the second photoresist in correspondence to a position where the conductive post is to be formed; and performing electroplating with the seed layer as an electrode.

After the electroplating, an operation of removing the first photoresist, the second photoresist, and the seed layer may additionally be included.

In certain embodiments of the invention, the solder resist layer may contain liquid crystal polymers.

In the operation of stacking and pressing, the inner substrate can be formed by forming a prepreg by impregnating glass fibers in a liquid crystal polymer resin; forming a metal layer on a surface of the prepreg; forming a second circuit pattern including a second electrode pad by selectively etching the metal layer; and stacking the insulation layer on the prepreg. Here, the insulation layer can be made of a liquid crystal polymer resin or a prepreg formed by impregnating glass fibers in a liquid crystal polymer resin.

The conductive post and the second electrode pad can be attached to each other, where the conductive post and the second electrode pad may be attached by way of a conductive paste or a conductive adhesive.

The carrier can be a metal plate, and removing the carrier may be performed by etching the metal plate.

The metal plate can be made of any one or more selected from a group consisting of copper (Cu), nickel (Ni), aluminum (Al), stainless steel, and alloys of these metals.

The inner substrate can be a multilayer printed circuit board, in which insulating bodies having circuit patterns formed thereon are stacked in multiple layers.

Stacking the solder resist layer may include stacking a solder resist layer on one surface of each of two carriers, forming the first circuit pattern may include forming a first circuit pattern including a first electrode pad on each of the solder resist layers, forming the conductive post may include forming a conductive post on each of the first electrode pads, and stacking and pressing the carrier onto the insulation layer may include stacking and pressing each of the two carriers onto an insulation layer stacked in either side of the inner substrate such that a side of each of the two carriers having the conductive post formed thereon faces each of the insulation layers.

Another aspect of the invention provides a printed circuit board that includes an insulation layer; a first circuit pattern, which includes a first electrode pad, buried in the insulation layer such that a portion of the first circuit pattern is exposed at a surface of the insulation layer; an inner substrate, in which the insulation layer is stacked, and on which a second circuit pattern that includes a second electrode pad is formed; a conductive post buried in the insulation layer such that one end is, connected to the first electrode pad and the other end is connected to the second electrode pad; and a solder resist layer stacked on the insulation layer.

The printed circuit board may further include an aperture formed in the solder resist layer that opens up the first electrode pad, and a surface-treatment part formed on the first electrode pad. A solder bump may also be included that is formed on the surface-treatment part.

The solder resist layer can contain liquid crystal polymers. Also, the insulation layer can be made of a liquid crystal polymer resin or a prepreg formed by impregnating glass fibers in a liquid crystal polymer resin.

The inner substrate may be formed by impregnating glass fibers in a liquid crystal polymer resin.

Additional aspects and advantages of the present invention will be set forth in part in the description which follows, and in part will be obvious from the description, or may be learned by practice of the invention.

DETAILED DESCRIPTION

Figure 1:
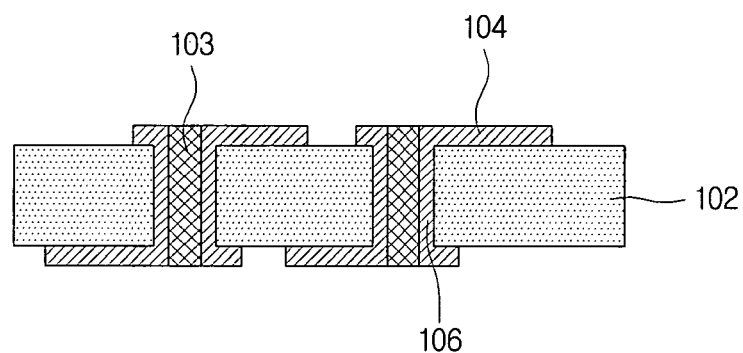
FIG. 1, FIG. 2, FIG. 3, FIG. 4, FIG. 5, and FIG. 6 are cross-sectional views representing a flow diagram illustrating a method of manufacturing a printed circuit board according to the related art.
Figure 2:
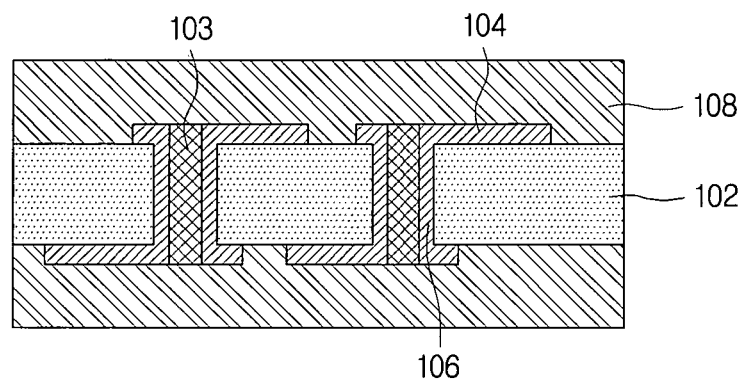
Figure 3:
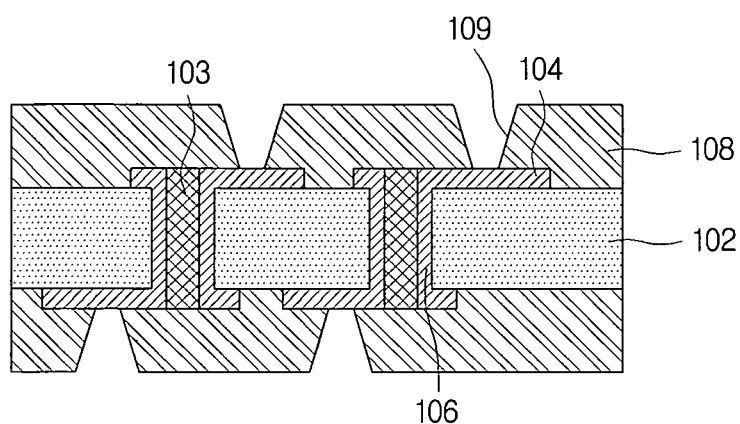
Figure 4:
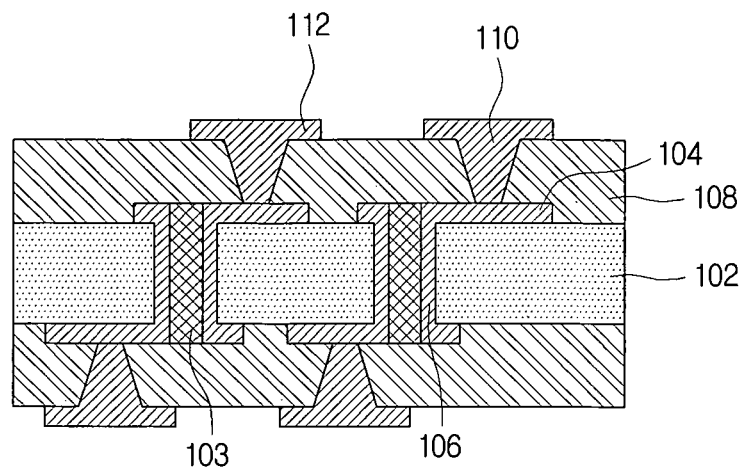
Figure 5:
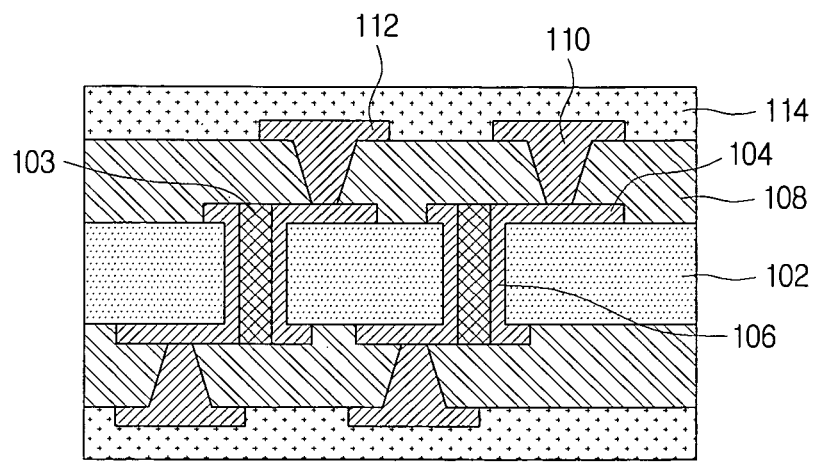
Figure 6:
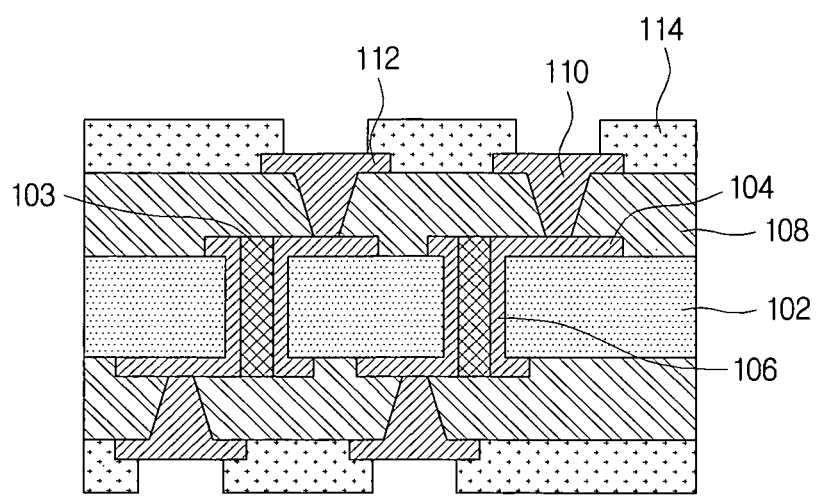

As the invention allows for various changes and numerous embodiments, particular embodiments will be illustrated in drawings and described in detail in the written description. However, this is not intended to limit the present invention to particular modes of practice, and it is to be appreciated that all changes, equivalents, and substitutes that do not depart from the spirit and technical scope of the present invention are encompassed in the present invention. In the description of the present invention, certain detailed explanations of related art are omitted when it is deemed that they may unnecessarily obscure the essence of the invention.

While such terms as "first," "second," etc., may be used to describe various elements, such elements must not be limited to the above terms. The above terms are used only to distinguish one element from another.

The terms used in the present application are merely used to describe particular embodiments, and are not intended to limit the present invention. An expression used in the singular encompasses the expression of the plural, unless it has a clearly different meaning in the context. In the present application, it is to be understood that the terms such as "including" or "having," etc., are intended to indicate the existence of the features, numbers, steps, actions, elements, parts, or combinations thereof disclosed in the specification, and are not intended to preclude the possibility that one or more other features, numbers, steps, actions, elements, parts, or combinations thereof may exist or may be added.

The printed circuit board and method of manufacturing the printed circuit board according to certain embodiments of the invention will be described below in more detail with reference to the accompanying drawings, in which those elements are rendered the same reference numeral that are the same or are in correspondence, regardless of the figure number, and redundant explanations are omitted.

Figure 7:
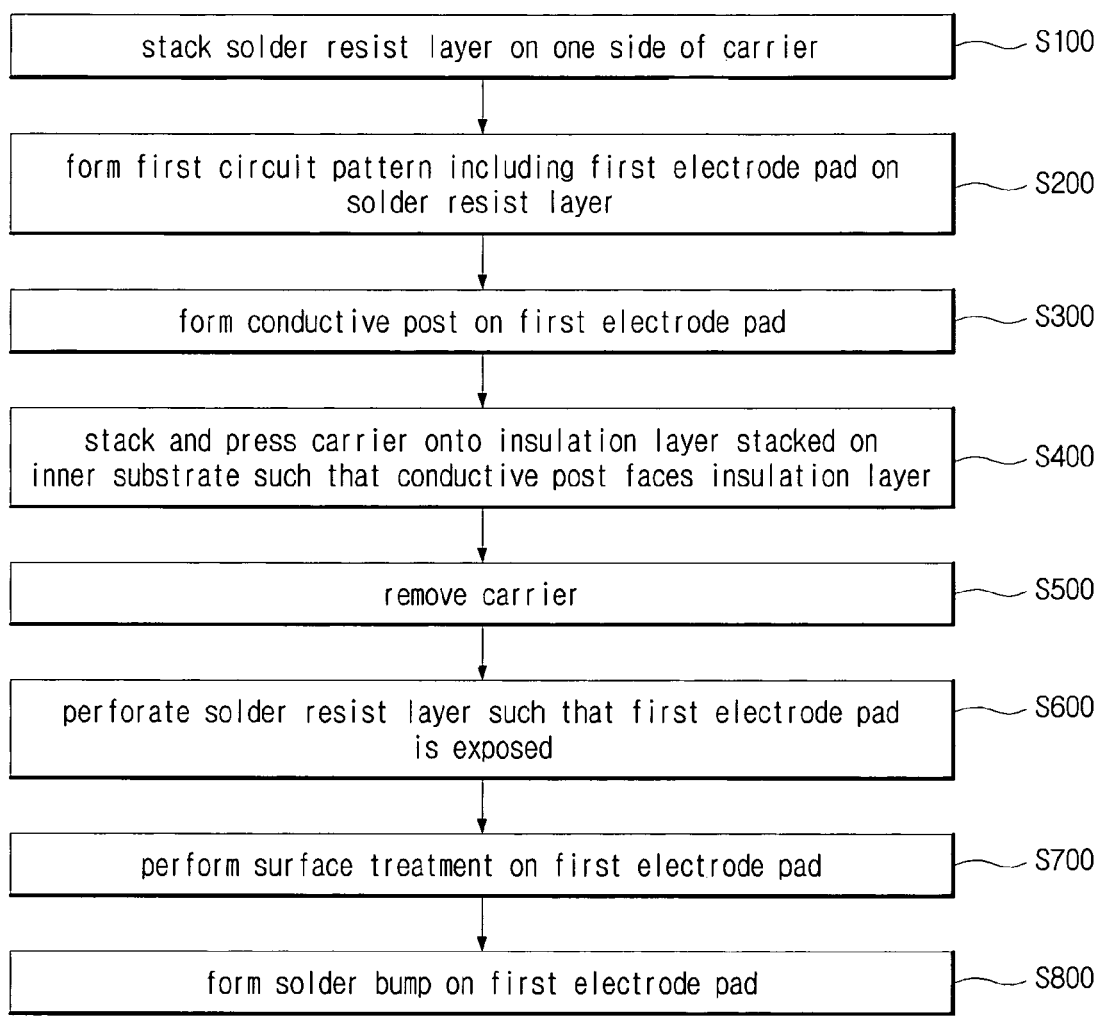
FIG. 7 is a flowchart illustrating a method of manufacturing a printed circuit board according to an embodiment of the invention.

FIG. 7 is a flowchart illustrating a method of manufacturing a printed circuit board according to an embodiment of the invention, and FIG. 8 through FIG. 22 are cross-sectional views representing a flow diagram illustrating a method of manufacturing a printed circuit board according to an embodiment of the invention. In FIGS. 8 to 22 are illustrated carriers 12, solder resist layers 14, a seed layer 15, first electrode pads 16, conductive posts 18, a prepreg 20, metal layers 22, via holes 24, second electrode pads 26, second circuit patterns 28, vias 30, insulation layers 32, apertures 34, surface-treatment parts 36, and solder bumps 38.

A method of manufacturing a printed circuit board according to this embodiment may include stacking solder resist layers 14 on one side of each carrier 12, forming first circuit patterns, which include first electrode pads 16, on the solder resist layers 14, forming conductive posts 18 on the first electrode pads 16, stacking and pressing the carriers 12 onto insulation layers 32 stacked in an inner substrate with the conductive posts 18 facing the insulation layers 32, and removing the carriers 12. As the conductive posts are pressed into the insulation layers to implement interlayer connections, certain drilling processes for forming via holes may be omitted, so that the degree of freedom can be increased in designing the circuits, and the circuits can be made to have greater densities. Also, as the circuit patterns may be buried in the insulation layers, the board can be made thinner, and the attachment areas between the circuit patterns and the insulation layers can be increased, to allow greater adhesion. Furthermore, by forming the solder resist layers beforehand on carriers and transferring the solder resist layers into the board using the carriers, the evenness of the solder resist layers can be increased.

In this particular embodiment, a method is presented of stacking a solder resist layer 14 on each of two carriers 12, forming the first electrode pads 16 and conductive posts 18 on each of the solder resist layers 14, and then stacking and pressing the two carriers 12 onto either sides of the inner substrate to form solder resist layers 14 on both sides of the inner substrate. Of course, it is possible to form the solder resist layer 14 on the inner substrate using one carrier 12.

Figure 8:
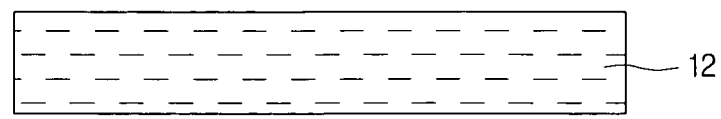
FIG. 8, FIG. 9, FIG. 10, FIG. 11, FIG. 12, FIG. 13, FIG. 14, FIG. 15, FIG. 16, FIG. 17, FIG. 18, FIG. 19, FIG. 20, FIG. 21, and FIG. 22 are cross-sectional views representing a flow diagram illustrating a method of manufacturing a printed circuit board according to an embodiment of the invention.
Figure 9:
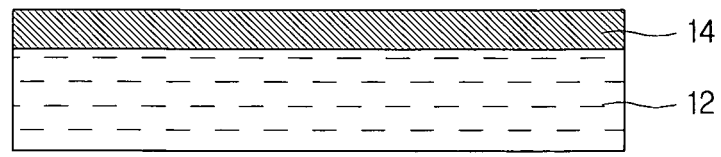

Looking at the method of manufacturing a printed circuit board according to the present embodiment, first, as illustrated in FIGS. 8 and 9, a solder resist layer 14 may be stacked on one side of a carrier 12 (S100). The solder resist layers 14 can be coated on the surfaces of the board to protect the circuit patterns formed on the surfaces and prevent undesired contacts when mounting a component.

In this embodiment, by forming the solder resist layer 14 beforehand on a flat carrier 12 and transferring the solder resist layer 14 into the board using the carrier 12, the evenness can be increased for the solder resist layer 14 formed on the board. Such evenness can have a large effect on increasing density in the printed circuit board.

The solder resist layer 14 stacked on the carrier 12 can be in the form of a liquid coated over the carrier 12 or can be in the form of a film.

The solder resist layer 14 can be made of liquid crystal polymers, or can be fabricated by impregnating liquid crystal polymers in solder resist ink made of heat-resistant resin.

In the related art, epoxy resin impregnated with glass fibers, etc., is commonly used as the insulation base in a board, while heat-resistant resin is commonly used for the solder resist. However, the insulation base of the related art typically has a high coefficient of thermal expansion, and the solder resist typically has a much higher coefficient of thermal expansion compared to that of the insulation base, so that the board is subject to bending or, when mounting a semiconductor chip, to cracking, due to the difference in thermal expansion during the manufacturing process or during use.

To counter these problems, there is a need for an insulation base and solder resist layer that are less prone to thermally contracting and expanding. In this particular embodiment, liquid crystal polymers, which have a low coefficient of thermal expansion, can be used in the solder resist layers 14, insulation layers 32, or insulation base in the inner substrate, to decrease the coefficient of thermal expansion of the entire printed circuit board and resolve the problems mentioned above.

A liquid crystal polymer resin displays a state similar to liquid crystals when in a molten phase. The liquid crystal polymer resin provides high deformability, and has a low thermal expansion, so that the rate of change in dimensions is low. Using such liquid crystal polymers in the insulation base or in the solder resist layers 14 can reduce the thermal expansion of the entire board, thereby allowing high-density mounting and preventing cracks.

The carriers 12 are removed after transferring the object of transfer into the board. The carriers 12 can be metal plates, in which case the carriers 12 can be removed in a subsequent process by applying an etchant corresponding to the metal used for the metal plates.

In cases where the solder resist layers 14 are stacked after applying a foam adhesive to the carriers 12, it may be possible to remove the carriers 12 by applying a certain level of heat to create foam in the foam adhesive.

The metal plates can contain any one or more selected from a group consisting of copper (Cu), nickel (Ni), aluminum (Al), stainless steel, and alloys of these metals. That is, a metal plate can be fabricated using copper, nickel, aluminum, stainless steel, or an alloy of these metals by itself, or can be fabricated using such metals in combination.

Figure 10:
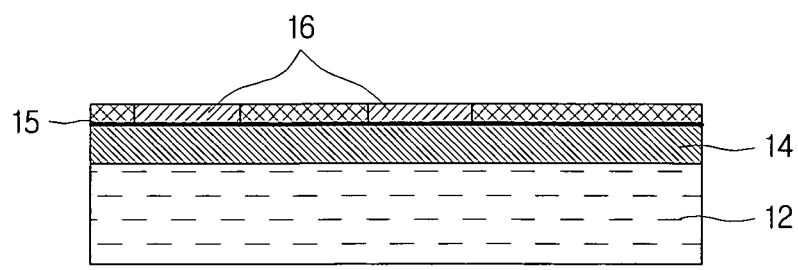

Next, as illustrated in FIG. 10, a first circuit pattern, which can include one or more first electrode pads 16, may be formed on the solder resist layer 14 stacked the carrier 12 (S200). This first circuit pattern (not shown) including first electrode pads 16 can be formed by stacking a seed layer 15 on the solder resist layer 14 by electroless plating, and then performing selective electroplating on the seed layer 15 to form a circuit pattern that protrudes in relievo from the seed layer 15. That is, a photoresist 13 may be stacked on the seed layer 15, and only the portions where the first circuit pattern is to be formed may be selectively removed by exposure and development, after which electroplating may be performed using the seed layer 15 as the electrode to deposit a plating layer and form the first circuit pattern including first electrode pads 16. In FIG. 10, only the first electrode pads 16 are illustrated.

Figure 11:
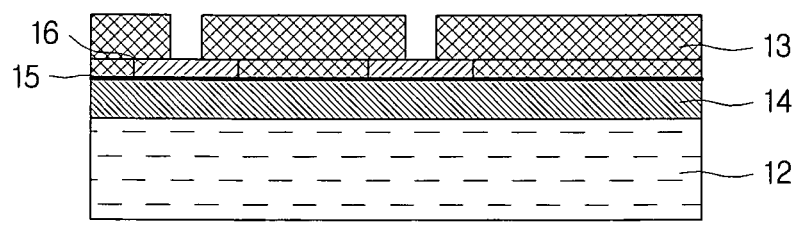
Figure 12:
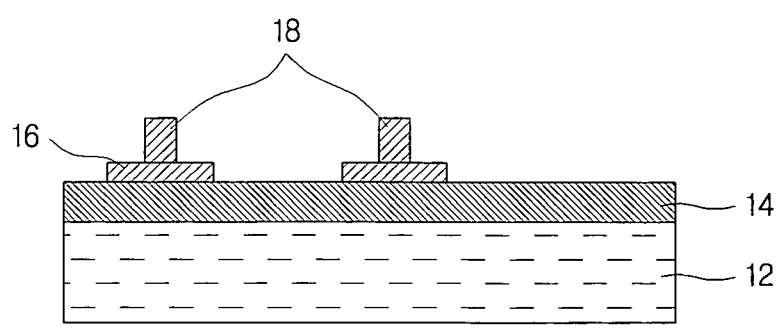

Next, as illustrated in FIGS. 11 and 12, conductive posts 18 may be formed on the first electrode pads 16 (S300). The conductive posts 18, which protrude out more than do the first electrode pads 16, may be formed on the first electrode pads 16 as pathways for interlayer electrical connection.

One example of a method of forming the conductive posts 18 is as follows. Without removing the photoresist 13 and seed layer 15 in the previous process, a photoresist 13 may be stacked again, and only the portions where the conductive posts 18 are to be formed may be selectively removed by exposure and development, after which electroplating may be performed using the seed layer 15 stacked on the solder resist layer 14 as the electrode to deposit a plating layer. Afterwards, the photoresists 13 remaining on the carrier 12 can be stripped, and the seed layer 15 can be etched off, to form conductive posts 18 on the carrier 12 that protrude out more than the first electrode pads 16.

Next, the carriers 12 may be stacked and pressed onto the insulation layers 32 of an inner substrate having insulation layers 32 stacked on, such that the conductive posts 18 face the insulation layers 32 (S400).

FIGS. 13 to 16 present an example of a method of forming an inner substrate having insulation layers 32 stacked on. In this particular embodiment, a prepreg 20 is used for the insulation base of the inner substrate, in which glass fibers are impregnated in a liquid crystal polymer resin. As described above, the liquid crystal polymers can be used for the insulation base, as well as solder resist layers 14, to lower the rate of thermal expansion of the entire board. Of course, the insulation base of the inner substrate is not limited to the prepreg 20 having glass fibers impregnated in a liquid crystal polymer resin as described above, and it is possible to use conventional insulation material.

Figure 13:
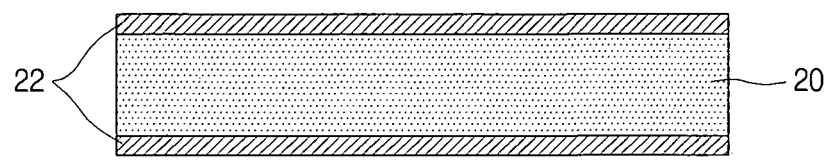
Figure 14:
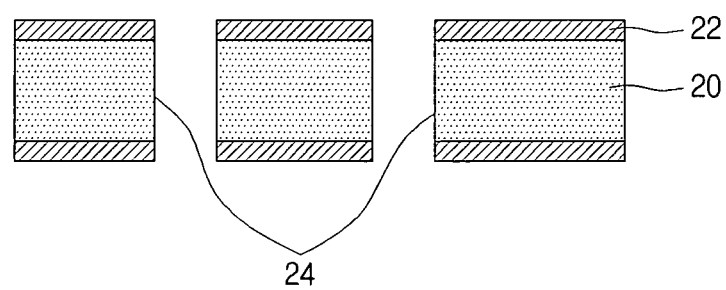
Figure 15:
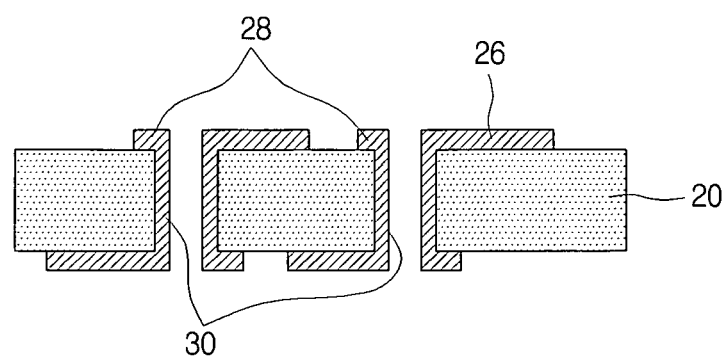
Figure 16:
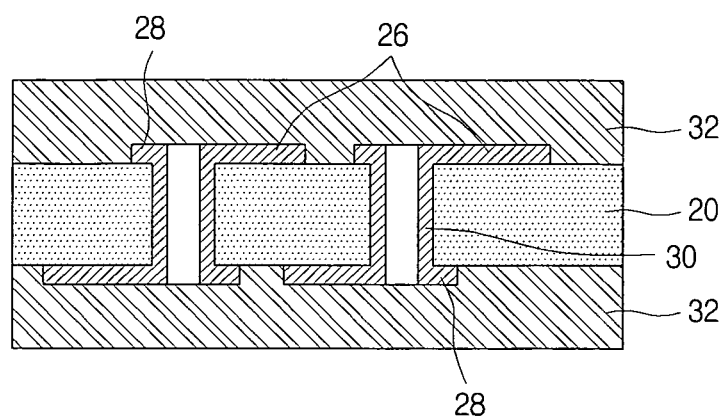

In the example method of forming the inner substrate, first, as illustrated in FIG. 13, glass fibers are impregnated in a liquid polymer resin to form prepreg 20, and metal layers 22 may be formed on either sides of the prepreg 20. Then, as illustrated in FIGS. 14 and 15, the prepreg 20 having metal layers 22 formed on both sides may be perforated to form via holes 24. Then, the prepreg 20 may be plated to form vias 30, after which the metal layers 22 stacked on the prepreg 20 may be selectively etched to form second circuit patterns 28 that include second electrode pads 26. The method of forming the second circuit patterns 28 including second electrode pads 26 can be substantially the same as the method described above for forming the first circuit patterns, and thus will not be described again. Next, as illustrated in FIG. 16, insulation layers 32 may be stacked on the prepreg 20 on which the second circuit patterns 28 are formed. Here, the insulation layers 32 may be made of a liquid crystal polymer resin or of prepregs 20 formed by impregnating glass fibers in a liquid crystal polymer resin.

That is, by using liquid crystal polymers for all or portions of the materials used for the insulation base of the inner substrate, the insulation layers 32 built up on the inner substrate, and the solder resist layers 14 stacked on the outermost layers of the printed circuit board, the coefficient of thermal expansion can be lowered for the entire printed circuit board. Of course, it is possible to use materials containing liquid crystal polymers for only parts of the insulation base of the inner substrate, the insulation layers 32 built up on the inner substrate, and the solder resist layers 14 stacked on the outermost layers of the printed circuit board.

The inner substrate may be a multilayer printed circuit board, in which insulating bodies that have circuit patterns formed thereon are stacked in multiple layers.

Figure 17:
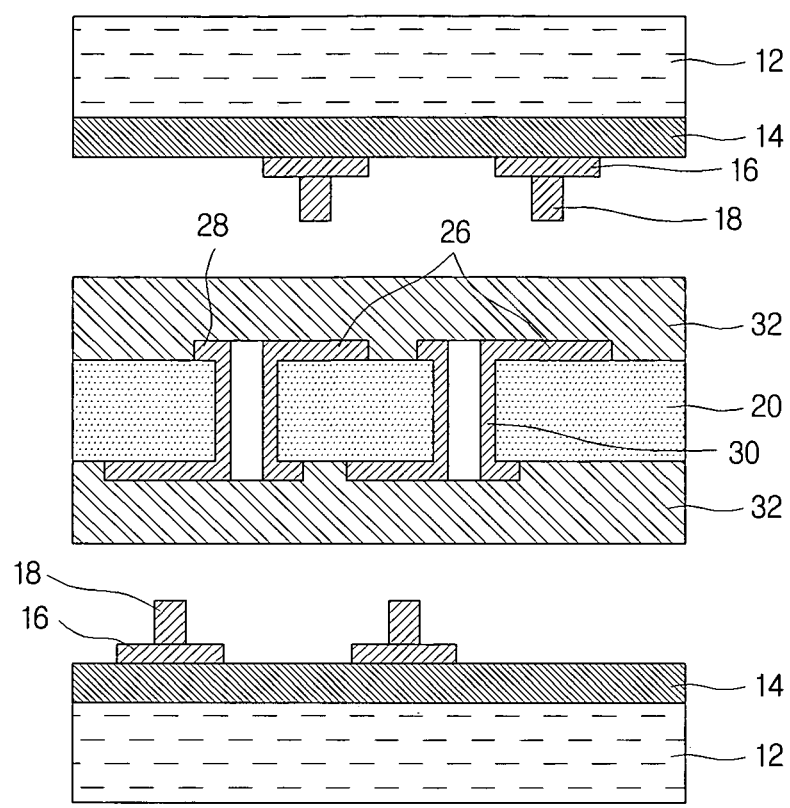
Figure 18:
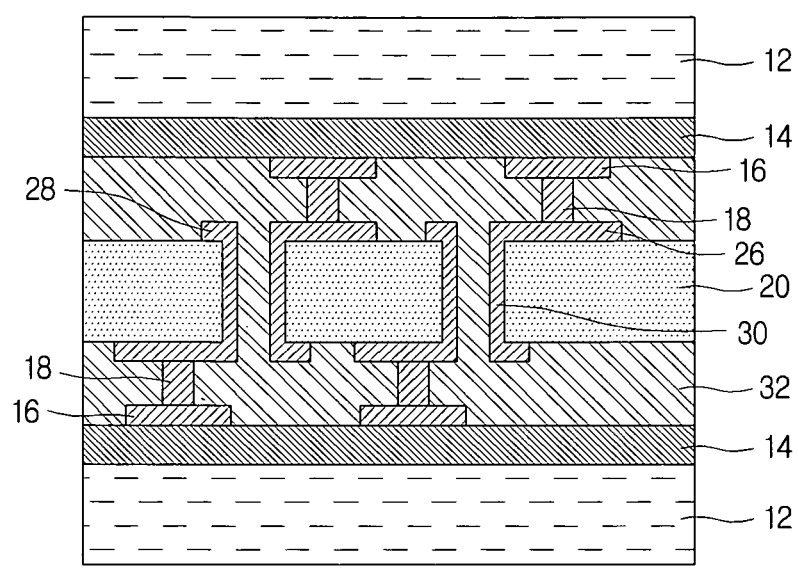

In this embodiment an example method is presented, where, as illustrated in FIG. 17, the solder resist layers 14 may be stacked respectively on two carriers 12, and the first electrode pads 16 and the conductive posts 18 may be formed on each of the solder resist layers 14. Afterwards, as illustrated in FIG. 18, the two carriers 12 may be stacked onto the inner substrate having insulation layers 32 stacked on both sides, such that the conductive posts 18 formed on the two carriers 12 face each other, and then the carriers 12 may be pressed together such that the first circuit patterns and conductive posts 18 formed on the carriers 12 may be buried in the insulation layers 32.

As a result of this process, the conductive posts 18 may be placed in contact with the second electrode pads 26 of the inner substrate, so that there are electrical connections formed between layers. Conductive paste or conductive adhesive may be used to strengthen the adhesion between the conductive posts 18 and the second electrode pads 26.

When the carriers 12 are pressed, the first circuit patterns including first electrode pads 16, as well as the conductive posts 18, formed protruding from the solder resist layers 14 of the carriers 12 can be forced in and buried in the insulation layers 32. Here, the carriers 12 may be pressed such that the conductive posts 18 come into contact with the second electrode pads 26.

In pressing the carriers 12, portions of the insulation layers 32 can be forced in to fill the insides of the vias 30.

Figure 19:
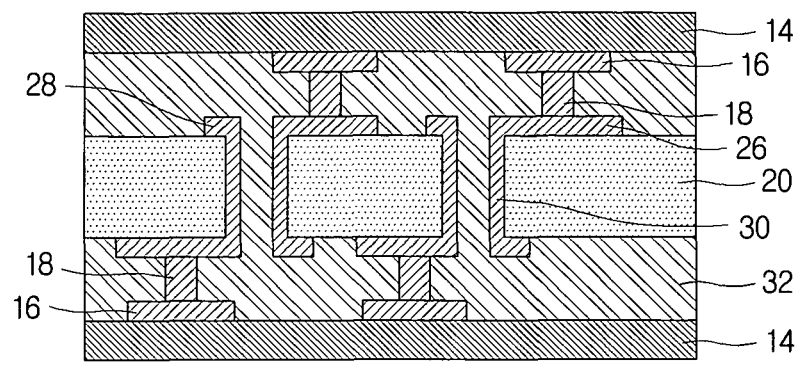

Next, as illustrated in FIG. 19, the carriers 12 may be removed (S500). When the carriers 12 are removed, the solder resist layers 14, first circuit patterns, and conductive posts 18 that were previously stacked on the carriers 12 can be transferred into the insulation layers 32.

By forming the solder resist layers 14 beforehand on flat carriers 12 and using the carriers 12 to transfer the solder resist layers 14 into the board, the evenness of the solder resist layers 14 formed on the board can be increased.

The carriers 12 can be made of metal plates, in which case the carriers 12 can be removed by applying an etchant corresponding to the metal material used for the metal plates.

In cases where the solder resist layers 14 are stacked after applying a foam adhesive to the carriers 12, it may be possible to remove the carriers 12 by applying a certain level of heat to create foam in the foam adhesive.

Figure 20:
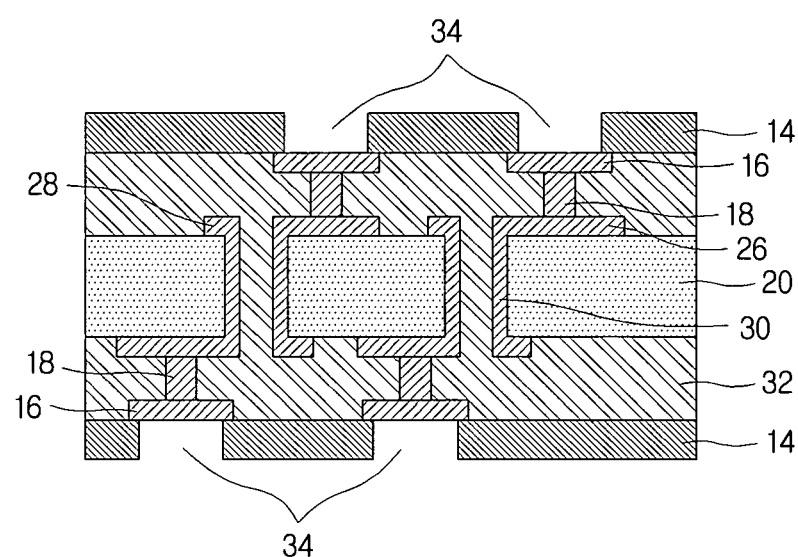

Next, as illustrated in FIG. 20, the solder resist layers 14 may be perforated such that the first electrode pads 16 transferred into the insulation layers 32 are exposed (S600). In perforating the solder resist layers 14, $CO_2$ laser, YAG laser, excimer laser, etc., may be used.

Figure 21:
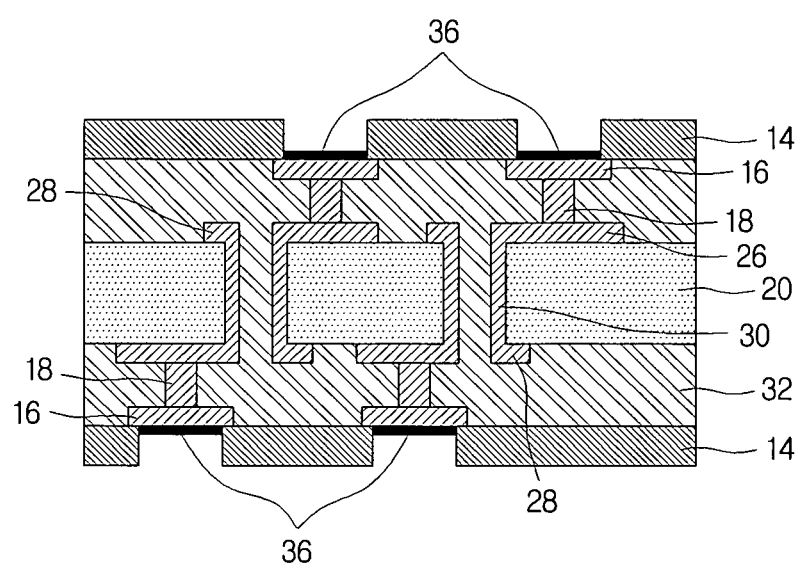

Next, as illustrated in FIG. 21, surface-treatment parts 36 may be formed, by performing surface treatment on the first electrode pads 16 exposed with the perforating of the solder resist layers 14, to prevent the opened areas from becoming oxidized (S700). A method known to those skilled in the art can be used as the method of surface treatment, such as HASL (hot air solder leveling), pre-flux coating, nickel electroless plating and/or electroplating, gold electroless plating and/or electroplating, palladium (Pd) electroless plating and/or electroplating, silver (Ag) electroless plating and/or electroplating, tin electroless plating and/or electroplating, etc.

Figure 22:
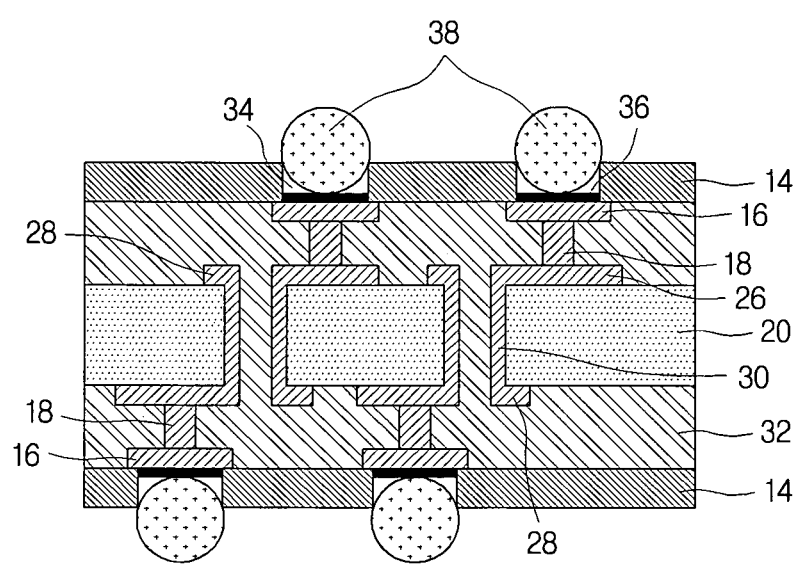

Next, as illustrated in FIG. 22, solder bumps 38 may be formed on the surface-treated first electrode pads 16 (S800). Any of a variety of methods known to those skilled in the art can be used for forming the solder bumps 38 according to the method of connection to the semiconductor chip mounted on the printed circuit board, such as solder screen-printing and solder plating, etc.

Figure 23:
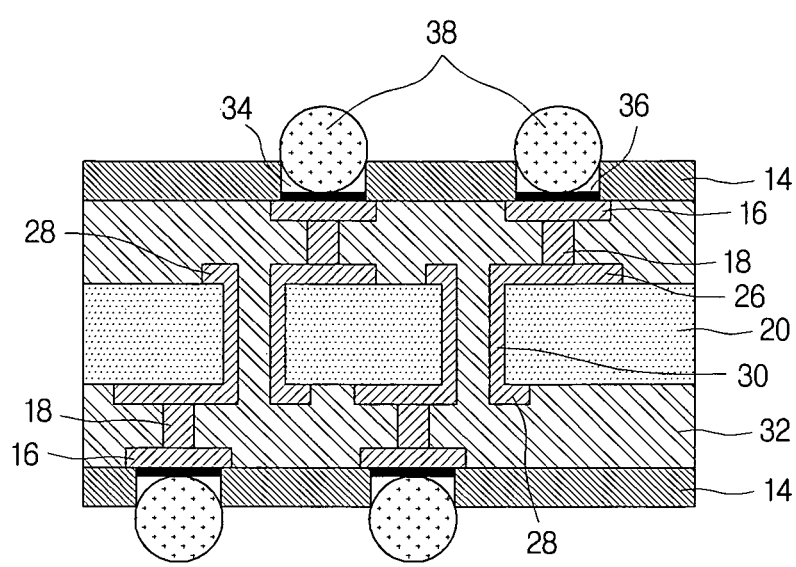
FIG. 23 is a cross-sectional view of a printed circuit board according to an embodiment of the invention.

FIG. 23 is a cross-sectional view of a printed circuit board according to an embodiment of the invention. In FIG. 23 are illustrated solder resist layers 14, first electrode pads 16, conductive posts 18, a prepreg 20, second electrode pads 26, second circuit patterns 28, vias 30, insulation layers 32, apertures 34, surface-treatment parts 36, and solder bumps 38.

It is difficult to apply the conventional interlayer connection method to designing high-density circuit patterns, as it is limited in implementing high-density interlayer connections. However, by interconnecting layers using conductive posts 18 in a board having circuit patterns buried in the insulation layers 32, according to the method of manufacturing a printed circuit board as described above, it is possible to manufacture high-density circuit patterns and boards with low thickness.

A printed circuit board according to this embodiment may include insulation layers 32, first circuit patterns including first electrode pads 16 which are buried in the insulation layers 32 with portions of the first circuit patterns exposed at the surfaces of the insulation layers 32, an inner substrate, in which the insulation layers 32 are stacked, and on which second circuit patterns 28 including second electrode pads 26 are formed, conductive posts buried in the insulation layers, which each have one end connected to a first electrode pad 16 and the other end connected to a second electrode pad 26, and solder resist layers 14 stacked on the insulation layer 32.

Apertures 34 may be formed in the solder resist layers 14 which open the first electrode pads 16, and on the first electrode pads 16 opened by the apertures 34, surface-treatment parts 36 may be formed according to a surface treatment method described above. Also, solder bumps 38 may be formed on the surface-treatment parts 36.

The solder resist layers 14 can be made of liquid crystal polymers, or can be fabricated by impregnating liquid crystal polymers in solder resist ink made of heat-resistant resin.

As described above with reference to the procedures for manufacturing a printed circuit board, the first circuit patterns (not shown) including first electrode pads 16 formed protruding from the carriers 12 may be pressed onto the sides of the insulation layers 32, so that the first circuit patterns including the first electrode pads 16 may be buried respectively in the insulation layers 32. In addition to the circuit patterns, the carriers 12 also have conductive posts 18 protruding out, so that electrical pathways can be formed between circuit patterns when the first electrode pads 16 and the second electrode pads 26 are connected by the conductive posts 18.

In the related art, epoxy resin impregnated with glass fibers, etc., is commonly used as the insulation base in a board, while heat-resistant resin is commonly used for the solder resist. However, the insulation base of the related art typically has a high coefficient of thermal expansion, and the solder resist typically has a much higher coefficient of thermal expansion compared to that of the insulation base, so that the board is subject to cracking, due to the difference in thermal expansion, during the manufacturing process or during use.

To counter these problems, there is a need for an insulation base and solder resist layer that are less prone to thermally contracting and expanding, and in this embodiment, liquid crystal polymers, which have a low coefficient of thermal expansion, can be used in the solder resist layers 14 or in the insulation base of the inner substrate, to decrease the coefficient of thermal expansion of the entire printed circuit board and resolve the problems mentioned above.

A liquid crystal polymer resin displays a state similar to liquid crystals when in a molten phase. The liquid crystal polymer resin provides high deformability, and has a low thermal expansion, so that the rate of change in dimensions is low. Using such liquid crystal polymers in the insulation base or in the solder resist layers 14 can reduce the thermal expansion of the entire board, thereby allowing high-density mounting and preventing cracks.

Also, a liquid crystal polymer resin or a prepreg 20, in which glass fibers are impregnated in a liquid crystal polymer resin, can be used for the insulation layers 32 or the insulation base of the inner substrate. By using liquid crystal polymers for the insulation base, as well as for the solder resist layers 14, the rate of thermal expansion of the entire board can be lowered. Of course, the insulation base of the inner substrate is not limited to the prepreg 20 having glass fibers impregnated in a liquid crystal polymer resin as described above, and it is possible to use conventional insulation material.

The conductive posts 18 can be formed by depositing a conductive metal on the first electrode pads 16, and as the conductive posts 18 are forced into and buried in the insulation layers 32, they may be put into contact with the second electrode pads 26, to form interlayer electrical connections.

Other elements of this embodiment are substantially the same as those described above and thus will not be described again.

According to certain aspects of the invention as set forth above, interlayer connections may be implemented using conductive posts, whereby certain drilling processes for forming via holes can be omitted, the degree of freedom can be increased in designing the circuits, and the circuits can be made to have greater densities.

Also, as the circuit patterns may be buried in the insulation layers, the board can be made thinner, and the attachment areas between the circuit patterns and the insulation layers can be increased, to allow greater adhesion.

Furthermore, by using an insulation material having a low coefficient of thermal expansion for the insulation layers and the solder resist layers, the coefficient of thermal expansion of the entire printed circuit board can be lowered.

Also, by forming the solder resist layers beforehand on carriers and transferring the solder resist layers into the board using the carriers, the evenness of the solder resist layers can be increased.

While the spirit of the invention has been described in detail with reference to particular embodiments, the embodiments are for illustrative purposes only and do not limit the invention. It is to be appreciated that those skilled in the art can change or modify the embodiments without departing from the scope and spirit of the invention.

What is claimed is:

1. A method of manufacturing a printed circuit board, the method comprising:
    stacking a solder resist layer flat on one side of a carrier;
    forming a first circuit pattern on the solder resist layer, the first circuit pattern including a first electrode pad;
    forming a conductive post on the first electrode pad;
    stacking and pressing the carrier onto an insulation layer stacked in an inner substrate such that the conductive post faces the insulation layer and a thickness of the inner substrate is made more uniform; and
    removing the carrier in such a way that the solder resist layer remains on the insulation layer,
    wherein forming the first circuit pattern comprises:
        forming a seed layer on the solder resist layer by performing electroless plating;
        stacking a first photoresist on the seed layer;
        selectively removing a portion of the first photoresist in correspondence to a position where the first circuit pattern is to be formed; and
        performing electroplating with the seed layer as an electrode,
    wherein forming the conductive post comprises:
        stacking a second photoresist such that the second photoresist covers the first circuit pattern and the first photoresist;
        selectively removing a portion of the second photoresist in correspondence to a position where the conductive post is to be formed; and
        performing electroplating with the seed layer as an electrode, and
    wherein stacking the solder resist layer comprises:
        stacking a solder resist layer on one surface of each of two carriers,
    forming the first circuit pattern comprises:
        forming a first circuit pattern including a first electrode pad on each of the solder resist layers,
    forming the conductive post comprises:
        forming a conductive post on each of the first electrode pads, and
    stacking and pressing the carrier onto the insulation layer comprises:
        stacking and pressing each of the two carriers onto an insulation layer stacked in either side of the inner substrate such that a side of each of the two carriers having the conductive post formed thereon faces each of the insulation layers.

2. The method of claim 1, further comprising, after removing the carrier:

perforating the solder resist layer such that the first electrode pad is exposed; and performing surface treatment on the first electrode pad.

3. The method of claim 2, further comprising, after the surface treatment:

forming a solder bump on the first electrode pad.

4. The method of claim 1, further comprising, after performing the electroplating:

removing the first photoresist, the second photoresist, and the seed layer.

5. The method of claim 1, wherein the solder resist layer contains a liquid crystal polymer.

6. The method of claim 1, wherein the inner substrate is formed by a set of procedures comprising:

forming a prepreg by impregnating glass fibers in a liquid crystal polymer resin;

forming a metal layer on a surface of the prepreg;

forming a second circuit pattern including a second electrode pad by selectively etching the metal layer; and stacking the insulation layer on the prepreg.

7. The method of claim 6, wherein the insulation layer is made of a liquid crystal polymer resin or a prepreg formed by impregnating glass fibers in a liquid crystal polymer resin.

8. The method of claim 6, wherein the conductive post and the second electrode pad are attached to each other.

9. The method of claim 8, wherein the conductive post and the second electrode pad are attached to each other by way of a conductive paste or a conductive adhesive.

10. The method of claim 1, wherein the carrier is a metal plate, and removing the carrier is performed by etching the metal plate.

11. The method of claim 10, wherein the metal plate contains any one or more selected from a group consisting of copper (Cu), nickel (Ni), aluminum (Al), stainless steel, and alloys thereof.

12. The method of claim 1, wherein the inner substrate is a multilayer printed circuit board having insulating bodies having circuit patterns formed thereon stacked in multiple layers.

* * * * *